United States Patent [19]

Yokouchi et al.

[11] Patent Number: 4,551,821
[45] Date of Patent: Nov. 5, 1985

[54] DATA BUS PRECHARGING CIRCUITS

[75] Inventors: Hiroshi Yokouchi; Ryuichi Iketani, both of Tokyo, Japan

[73] Assignee: Oki Electric Industry Co., Ltd., Tokyo, Japan

[21] Appl. No.: 483,572

[22] Filed: Apr. 11, 1983

[30] Foreign Application Priority Data

Apr. 23, 1982 [JP]  Japan .................................. 57-67452

[51] Int. Cl.[4] ........................................... G11C 11/40
[52] U.S. Cl. .................................................. 365/203
[58] Field of Search ................ 365/203, 189, 230, 233

[56] References Cited

U.S. PATENT DOCUMENTS 4,131,951 12/1978 Asahi .................... 365/203

Primary Examiner—Joseph A. Popek
Attorney, Agent, or Firm—Wenderoth, Lind & Ponack

[57] ABSTRACT

A data bus precharging circuit has: a charging circuit for charging a common data bus in response to a precharge control signal, the common data bus having a plurality of bit lines; a precharge sensing circuit for generating a reset signal when all of the bit lines of the data bus are charged; and a control signal generating circuit for the charging circuit to charge the data bus when a precharge clock signal is inputted to the control signal generating circuit, and for disabling the charging circuit from charging the data bus when the reset signal is inputted to the control signal generating circuit from the precharge sensing circuit.

2 Claims, 21 Drawing Figures

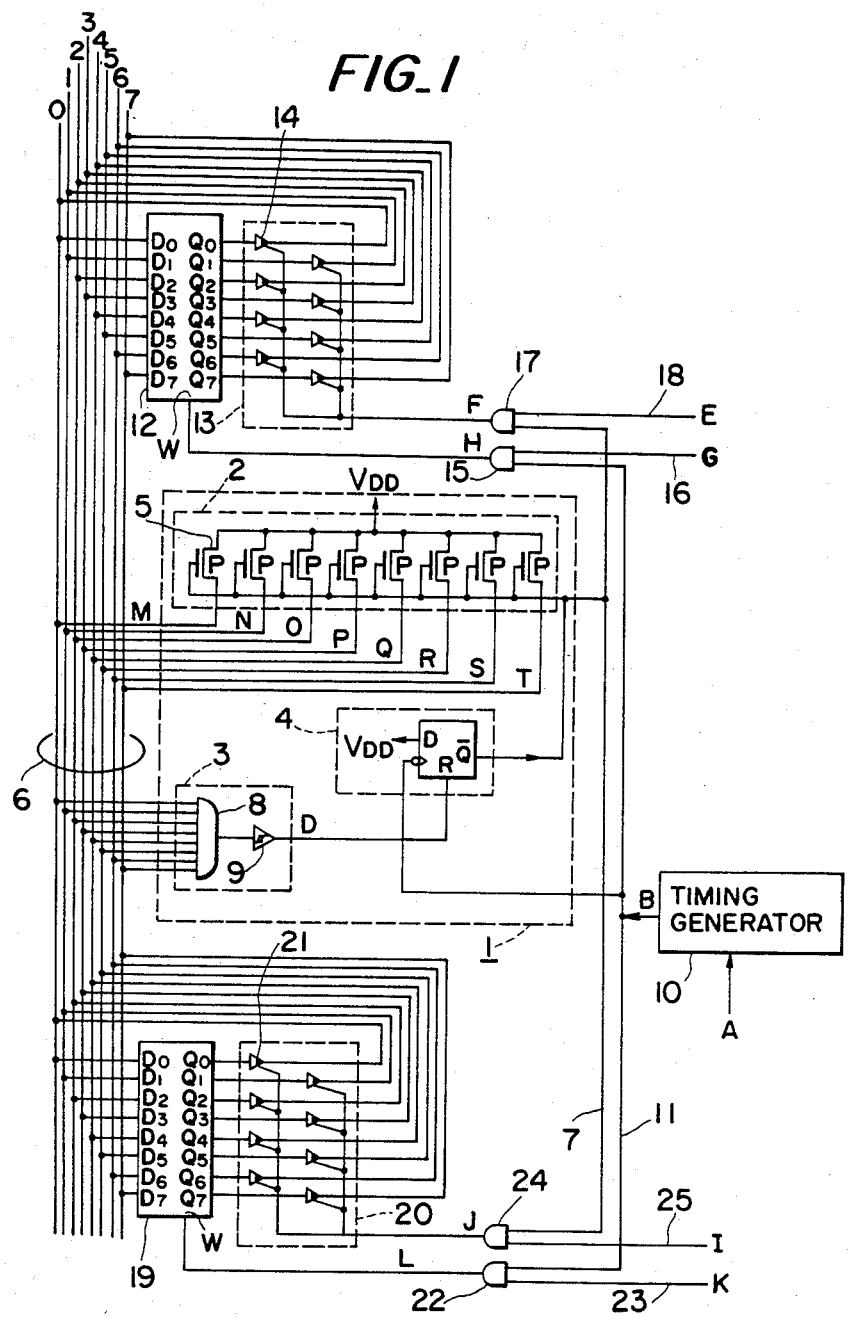
FIG_1

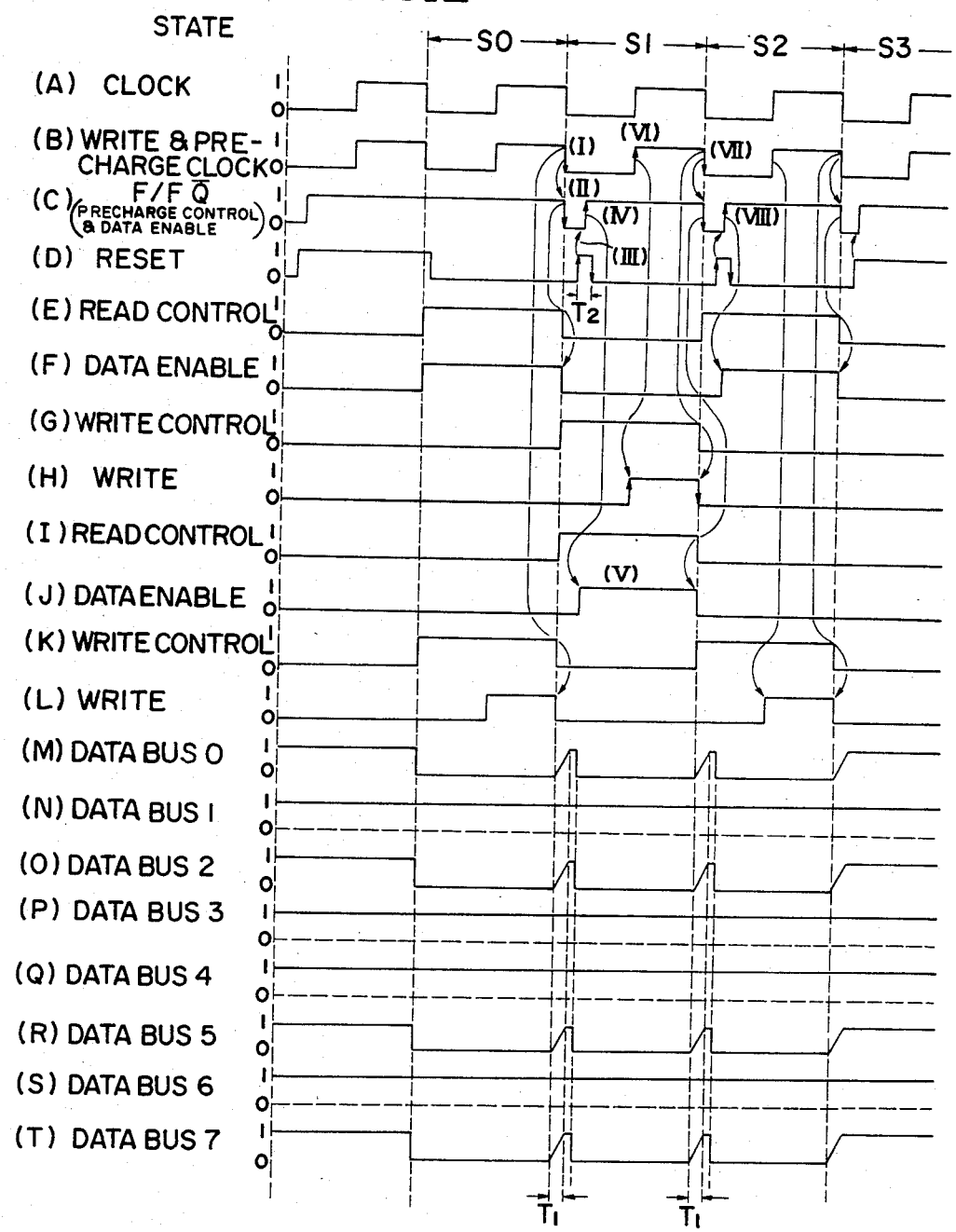

DATA BUS PRECHARGING CIRCUITS

BACKGROUND OF THE INVENTION

This invention relates to a precharging circuit and, more specifically, to a data bus precharging circuit for use in circuit devices having data buses.

Monolithic integrated circuit devices such as read-only memories (ROMs), random access memories (RAMs), and central processing units (CPUs) include data buses for selectively sending and receiving data signals. In general, every bit line of the common data bus in such devices in initialized to a logic "1" (a power source potential $V_{DD}$) before data signals in one internal memory circuit are sent to another internal memory circuit. However, due to the parasitic capacitance associated with every bit line of the data bus, it will take a long period of time, for example, 150 to 300 nanoseconds, to establish data signals on the data bus after every bit of the data bus has been initialized with a logic "1" or a power source potential $V_{DD}$. To avoid this problem, a data bus precharging circuit has been commonly employed for the data bus to establish the initial condition of the data bus at a high speed.

The data bus precharging circuit is a charging circuit for decreasing the time required for the initial condition of the data bus by forcibly establishing a logic "1" on every bit line of the data bus, before the data signal will be set on the data bus.

In general, one state cycle for sending data in one memory circuit, such as a register, to another memory circuit, such as a register, includes three steps as follows:

In the first step, when the precharging circuit is inputted with a precharging control signal, the data bus is precharged to a power source potential (a logic "1") by the output signal therefrom.

In the second step, when a read signal is inputted into a selected internal register, data signals from the register are outputted to the data bus.

In the third step, when a write signal is inputted into another internal register, data signals on the bus are stored therein.

However, a prior art precharging circuit requires three independent signal sources for generating a precharging control signal, a read signal, and a write signal, respectively. Also, the prior art precharging circuit has a disadvantage in that one state cycle needs a clock signal of three to five cycles, thereby taking a long operational time for processing data in one state.

Furthermore, the prior art circuit has another disadvantage in that it places the bus in a set condition, or in a logic "1" state, during a fixed cycle so that the time to set the data into the data bus become longer. For example, in the prior art circuit used in a monolithic integrate CPU (Central Processing Unit) was difficult to realize a state cycle time of less than 100 nanoseconds.

SUMMARY OF THE INVENTION

Accordingly, it is an object of this invention to provide an improved data bus precharging circuit which can operate a device having data buses at a high speed.

It is another object of this invention to provide an improved data bus precharging circuit suitable for being constructed as a monolithic integrated circuit device.

According to this invention there is provided a data bus precharging circuit comprising a charging circuit for charging a common data bus in response to a precharge control signal, the common data bus having a plurality of bit lines, a precharging sensing circuit for generating a reset signal to the charging circuit when all bit lines of the data bus are charged, and a control signal generating circuit for ending the precharging of the data bus when a precharge clock signal is inputted to the control signal generating circuit, and for generating the precharge control signal to the charging circuit when the reset signal is inputted to the control signal generating circuit.

The data bus precharging circuit according to this invention is characterized in that it requires only one cycle of a clock signal in one state, thus reducing its precharging period and its operational power consumption. In addition, since one clock signal can be used as a precharging clock signal, and a data enabling signal, and a write clock signal, the timing circuit of the precharging circuit can be simplified. Moreover, since the write or read operation starts immediately after the charging of the data bus, this precharging circuit can operate at a high speed.

BRIEF DESCRIPTION OF THE DRAWINGS

In the accompanying drawings:

FIG. 1 is a schematic diagram showing one embodiment of the data bus precharging circuit according to this invention; and FIG. 2 is a timing chart illustrating the signal waveforms at various points or nodes in the circuit of FIG. 1.

DESCRIPTION OF THE PREFERRED EMBODIMENTS

Referring to FIGS. 1 and 2, an improved data bus precharging circuit 1 includes a charging circuit 2, a precharging sense circuit 3, and a control signal generating circuit 4 which does not contain any three-state circuits therein. The charging circuit 2 includes a plurality of P-type MOS FET's 5 which have drain electrodes commonly connected to a power source voltage $V_{DD}$, source electrodes connected to data bus lines 6, and gate electrodes commonly connected to a line 7. The precharging sense circuit 3 comprises an AND logic circuit 8 and a Schmitt buffer circuit 9. The inputs of the AND logic circuit 8 are connected to the data bus lines 6 and its output lis connected to the input of the Schmitt buffer circuit 9. The control signal generator 4 is preferably formed of a data-type flip-flop. The data terminal D of the flip-flop is coupled to the power source $V_{DD}$, its $\overline{Q}$ terminal is connected to the gate electrodes of the MOS FET's 5, and its reset terminal R is connected to the output of the buffer circuit 9.

A timing generator circuit 10 generates a precharge clock and write signal B in response to a clock signal A, the output terminal of the timing circuit 10 being connected to a line 11 and to the clock terminal of the flip-flop of the control signal generator 4. Every input of a register 12 used as a memory means is coupled to the bit lines of the data bus lines 6, respectively, and every output is coupled to a gate circuit 13. The gate circuit 13 is formed of a plurality of three-state circuits 14 having their respective outputs connected to the data bus lines 6. The three-state circuits 14 deliver the data from the register 12 to the data bus lines 6 when a enabling signal F is inputted thereto. When a data enabling signal is not inputted thereto, the outputs of the three-state circuits 14 are an open circuit so as to enable other data sources to feed data to the data bus lines 6. The output of a two input AND logic circuit 15 is connected to the write terminal of the register 12, two inputs thereof being connected to the output of the timing generator 10 and a write control signal line 16, respectively. The output of a two input AND logic circuit 17 is supplied to the gate circuit 13 to act as a gate enabling signal. The inputs of the AND logic circuit 17 are coupled to the read control signal line 18 and the gate of the MOS FET's 5, respectively. Respective inputs of a register 19 acting as a memory means are coupled to respective bit lines of the data bus lines 6, and the outputs of the register 19 are connected to an output gate circuit 20, respectively. The gate circuit 20 comprises a plurality of three-state circuits 21 with their outputs connected to the bit lines of data bus lines 6, respectively. The three-state circuits 21 deliver data from the register 19 to the data bus lines 6 when a data enabling signal J is inputted thereto. When a data enabling signal is not inputted thereto, the outputs of the three-state circuits 21 are an open circuit so as to enable other data sources to feed data to the data bus lines 6. Also, the output of a two input AND logic circuit 22 is connected to the write terminal of the register 19. One input of the AND logic circuit 22 is coupled to the output of the timing generator 10 and the other coupled to a write control signal line 23. The output of a two input AND logic circuit 24 is connected to the gate circuit 20; one input of the AND logic circuit 24 is connected to a read control signal line 25 and the other input is connected to the gates of MOS FET's 5.

In operation, it is assumed that all bit lines 0 through 7 of the common data bus lines 6 have a binary code 01011010 in the state $S_0$, while the write control signal line 16, and the read control signal line 25 are at a logic "0" state, respectively, while the read control signal line 18 and the write control signal line 23 are at a logic "1" state. In the first state $S_1$, when the output signal B of the timing generator 10 changes from logic "1" to logic "0", the flip-flop 4 is set, whereby the precharge control signal C at the output $\bar{Q}$ changes from logic "1" to logic "0". (See (B) and (C) II in FIG. 2). Therefore, the MOS FET's 5 of the charging circuit 2 conduct so that every bit line of the data bus lines 6 is charged to the source potential $V_{DD}$ or logic "1" in the time $T_1$. (See (M), (N), (O), (Q), (R), (S), (T) in FIG. 2)

Next, when all bit lines of data bus lines 6 become a logic "1", the precharge sensing circuit 3 will send a reset signal D or a logic "1" signal to the reset terminal R during an interval $T_2$. (See (D) (III) in FIG. 2). Due to this reset signal D, the flip-flop 4 is reset so as to change its $\bar{Q}$ output from a logic "0" to a logic "1" state as shown by (IV) in FIG. 2. Therefore, the MOS FET's 5 of the charging circuit 2 are turned off so that the path between the charging circuit 2 and the data bus lines 6 is cut off.

Next, when a read control signal E and a write control signal K become a logic "0" and both write control signal G and read control signal I become a logic "1", the AND logic circuit 24 outputs a data enabling signal of a logic "1" level so that the gate circuit 20 opens, thereby transferring the memory code 01011010 stored in the register 19 to the data bus lines 6. (See (V), (J), (M), (N), (O), (P), (Q), (R), (S), and (T) in FIG. 2). Thus, the reset signal D of the precharge sensing circuit 3 changes from logic "1" to logic "0" as shown in FIG. 2(D). Next, when the write clock signal B changes from a logic "0" to a logic "1" as shown in FIG. 2 (B), the content on the data bus lines 6 is stored in the register 12 in response to the write signal as shown in FIG. 2 (H), thereby completing one cycle of the circuit operation.

Next, since the output signal B of the timing generator 10 changes from a logic "1" to a logic "0", the flip-flop 4 outputs the precharge control signal C of a logic "0" level. (See (VII) in FIG. 2). Therefore, the MOS FET's 5 of the charging circuit 2 conduct so as to charge the data bus lines 6 to a source potential $V_{DD}$ or to a logic "1" level.

In the same manner as described above, the data signal can be read from or written into the data bus lines 6.

The data bus precharging circuit according to this invention makes it possible to operate an MOS integrated circuit CPU at a speed of less than 50 nanoseconds during one cycle. This invention can be utilized for all sorts of systems having data busses, and is especially useful for CPUs, RAMs, and ROMs which are fabricated in a monolithic IC form.

What is claimed is:

1. A data bus precharging circuit comprising:
    a charging circuit for charging a common data bus in response to a precharge control signal, said common data bus having a plurality of bit lines;
    a precharge sensing circuit for generating a reset signal when all of said plurality of bit lines of said data bus are charged, said sensing circuit sensing a charged bit line by sensing that a logic level of said bit line is a logic "1" level; and
    a control signal generating circuit for enabling said charging circuit to charge said data bus when a precharge clock signal is inputted to said control signal generating circuit, and for disabling said charging circuit from charging said data bus when said reset signal is inputted to said control signal generating circuit from said precharge sensing circuit.

2. A data bus precharging circuit as recited in claim 1, wherein said charging circuit comprises a plurality of MOS FET's, and said precharge sensing circuit comprises an AND logic circuit and a Schmitt buffer circuit, and said control signal generating circuit comprises a data type flip-flop.

* * * * *